US009472150B1

(12) United States Patent
Dai (10) Patent No.: US 9,472,150 B1
(45) Date of Patent: Oct. 18, 2016

(54) GATE DRIVING CIRCUIT APPLIED FOR 2D-3D SIGNAL SETTING

(71) Applicant: Shenzhen China Star Optoelectronics Technology Co., Ltd., Shenzhen, Guangdong (CN)

(72) Inventor: Chao Dai, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 225 days.

(21) Appl. No.: 14/398,739

(22) PCT Filed: Aug. 14, 2014

(86) PCT No.: PCT/CN2014/084331
§ 371 (c)(1),
(2) Date: Nov. 4, 2014

(87) PCT Pub. No.: WO2016/008186
PCT Pub. Date: Jan. 21, 2016

(30) Foreign Application Priority Data

Jul. 15, 2014 (CN) .......................... 2014 1 0337587

(51) Int. Cl.
*G09G 5/00* (2006.01)
*G09G 3/36* (2006.01)
*H04N 13/04* (2006.01)

(52) U.S. Cl.
CPC ........ *G09G 3/3648* (2013.01); *H04N 13/0454* (2013.01); *G09G 2300/04* (2013.01); *G09G 2310/08* (2013.01)

(58) Field of Classification Search
CPC ......... G09G 5/006; G09G 5/008; G09G 5/18
IPC ....................................................... G09G 5/006
See application file for complete search history.

(56) References Cited

U.S. PATENT DOCUMENTS

2010/0214279 A1* 8/2010 Kim ....................... G09G 3/344
345/213

* cited by examiner

*Primary Examiner* — Kumar Patel
*Assistant Examiner* — Mansour M Said
(74) *Attorney, Agent, or Firm* — Andrew C. Cheng (57) ABSTRACT

The present invention provides a gate driving circuit applied for 2D-3D signal setting, comprising: a plurality of GOA units which are cascade connected, and a Nth GOA unit controls charge to a Nth horizontal scanning line G(n) in a display area, and the Nth GOA unit controls charge to a Nth horizontal scanning line G(n) in a display area, and the Nth GOA unit comprises a pull-up controlling part, a pull-up part, a transmission part, a first pull-down part, a bootstrap capacitor part, a pull-down holding part and a pull-up compensation part; on the basis of the gate driving circuit utilizing the present GOA skill, the present invention adds a pull-up compensation part to compensate the leakage gap existing in the 2D signal transmission to ensure that the voltage level of the gate signal point Q(N) will not descend in leakage gap period; by introducing an additional DC control signal source DC to control the activation and deactivation of the pull-up compensation part for activating it in 2D mode to realize compensation and deactivating it in 3D mode to prevent the influence to the 3D signal transmission. The pull-up compensation part can be effectively controlled.

12 Claims, 9 Drawing Sheets

GATE DRIVING CIRCUIT APPLIED FOR 2D-3D SIGNAL SETTING

FIELD OF THE INVENTION

The present invention relates to a display skill field, and more particularly to a gate driving circuit applied for 2D-3D signal setting.

BACKGROUND OF THE INVENTION

GOA (Gate Driver on Array) skill is to integrate the TFT (Thin Film Transistor) of a gate driving circuit on the array substrate and to eliminate the integrated circuit part of the gate driving circuit located outside the array substrate. Accordingly, two aspects of material cost and process is considered to reduce the manufacture cost of the productions. GOA skill is a common gate driving circuit skill used in a present TFT-LCD (Thin Film Transistor-Liquid Crystal Display). The manufacture process is simple and provides great application possibilities. The functions of the GOA circuit mainly comprises: the present gate line outputs a high level signal with charging the capacitor of the shift register unit by using the high level signal outputted from the previous gate line, and then reset is achieved by using the high level signal outputted from the next gate line.

In 2D display mode, the GOA circuit transmission structure is that the present horizontal scanning line G(n) (n is a nature) directly transmits to the next horizontal scanning line G(n+1) thereafter. However, in 3D display mode, (which requires to respectively scanning displaying the images of the right eye and the left eye), the GOA circuit transmission structure is that the present horizontal scanning line G(n) transmits to the next second horizontal scanning line G(n+2) thereafter and the next horizontal scanning line G(n+1) keeps the same phase of the present horizontal scanning line G(n). Consequently, a floating period of one high frequency signal width redundantly appears between the next second horizontal scanning line G(n+2) and the present horizontal scanning line G(n) and leakage problem occurs.

For a large scale panel, once the GOA skill is utilized, as considering that the loadings of the wirings in the display area and GOA circuit area in the panel, the parasite capacitances and the resistances of element size are larger, multiple high frequency clock lines which at least six lines and even eight lines for some are generally utilized to reduce the RC loadings. For the GOA circuit having eight high frequency clock lines, the way of the utilized signal transmission is that N–4th level transmits the signal to the nth level in general.

Figure 1:
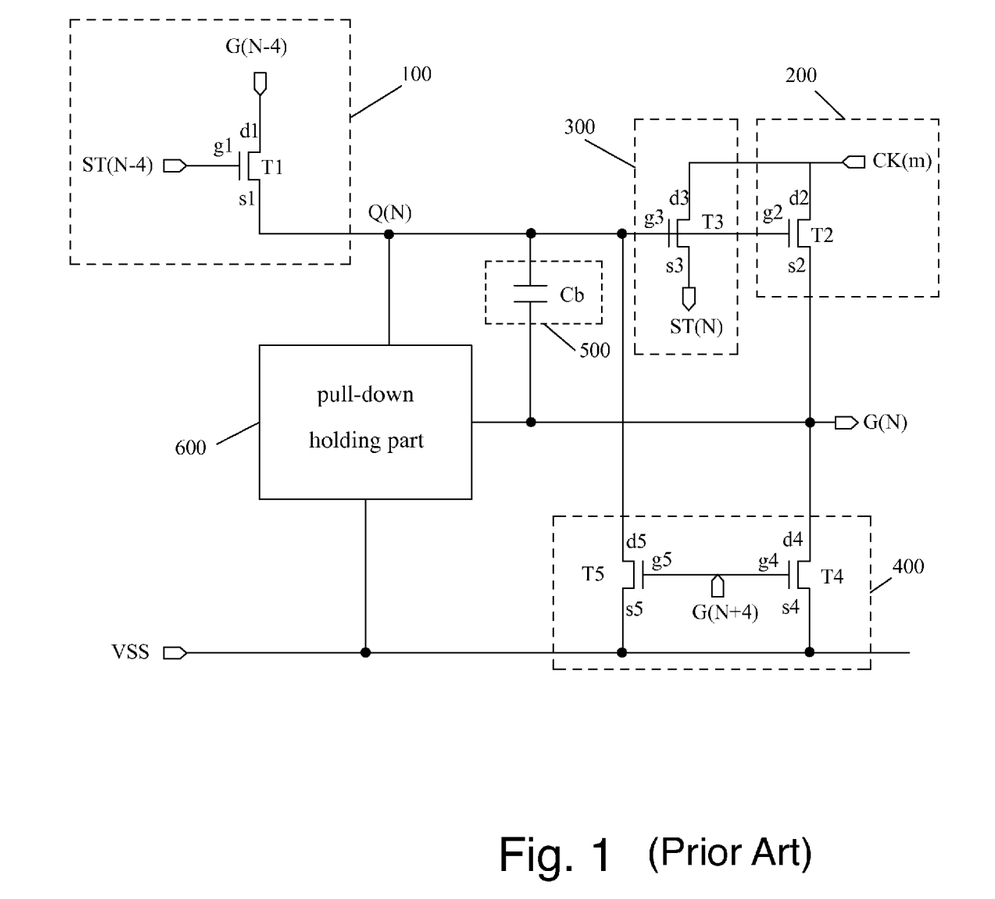
FIG. 1 is a structural diagram of a gate driving circuit commonly utilizing GOA skill according to prior art.

Please refer to FIG. 1, which is a single level structural diagram of a GOA circuit commonly employed in panel display according to prior art. It comprises: a plurality of GOA units which are cascade connected, and a nth gate driver on array unit controls charge to a nth horizontal scanning line G(n) in a display area, and the nth gate driver on array unit comprises pull-up controlling part 100, a pull-up part 200, a transmission part 300, a first pull-down part 400 (Key pull-down part), a bootstrap capacitor part 500 and a pull-down holding part 600 (Pull-down holding part). The pull-up part 200, the first pull-down part 400, the pull-down holding part 600 and the bootstrap capacitor part 500 are respectively coupled to a Nth gate signal point Q(n) and the Nth horizontal scanning line G(n), and the pull-up controlling part 100 and the transmission part 300 are respectively coupled to the Nth gate signal point Q(n), and the pull-down holding part 600 is inputted with a DC low voltage VSS. The pull-up controlling part 100 comprises a first transistor T1, and the pull-up part 200 comprises a second transistor T2, the transmission part 300 comprises a third transistor T3, and the first pull-down part 400 comprises a fourth transistor T4 and a fifth transistor T5, and the bootstrap capacitor part 500 comprises a capacitor Cb; the first transistor T1 comprises a first gate g1, a first source s1 and a first drain d1, and the second transistor T2 comprises a second gate g2, a second source s2 and a second drain d2, and the third transistor T3 comprises a third gate g3, a third source s3 and a third drain d3, and the fourth transistor T4 comprises a fourth gate g4, a fourth source s4 and a fourth drain d4, and the fifth transistor T5 comprises a fifth gate g5, a fifth source s5 and a fifth drain d5; the first gate g1 is inputted with a N–4th transmission signal ST(N–4), and the first drain d1 is electrically coupled to a N–4th horizontal scanning line G(N–4), and the first source s1 is electrically coupled to gate signal point Q(N); the second gate g2 is electrically coupled to the gate signal point Q(N), and the second drain d2 is inputted with a mth high frequency clock CK(m), and the second source s2 is electrically coupled to the Nth horizontal scanning line G(N); the third gate g3 is electrically coupled to the gate signal point Q(N), and the third drain d3 is inputted with the mth high frequency clock CK(m), and the third source s3 outputs a Nth transmission signal ST(N); the fourth gate g4 is electrically coupled to the N+4th horizontal scanning line G(N+4), and the fourth drain d4 is electrically coupled to the Nth horizontal scanning line G(N), and the fourth source s4 is inputted with the DC low voltage VSS; the fifth gate g5 is electrically coupled to the N+4th horizontal scanning line G(N+4), and the fifth drain d5 is electrically coupled to the gate signal point Q(N), and the fifth source s5 is inputted with the DC low voltage VSS; an upper electrode plate of the capacitor Cb is electrically coupled to the gate signal point and a lower electrode plate of the capacitor Cb is electrically coupled to the Nth horizontal scanning line G(N). All of the first transistor T1, the second transistor T2, the third transistor T3, the fourth transistor T4 and the fifth transistor T5 are thin film transistors. The circuit structure as shown in FIG. 1 is a connection solution utilizing eight high frequency clock lines mainly for the large scale panel GOA skill. As shown in FIG. 1, the control signals of the pull-up controlling part 100 mainly come from the N–4th horizontal scanning line G(N–4). The control signals of the first pull-down part 400 come from the N+4th horizontal scanning line G(N+4).

Figure 2A:
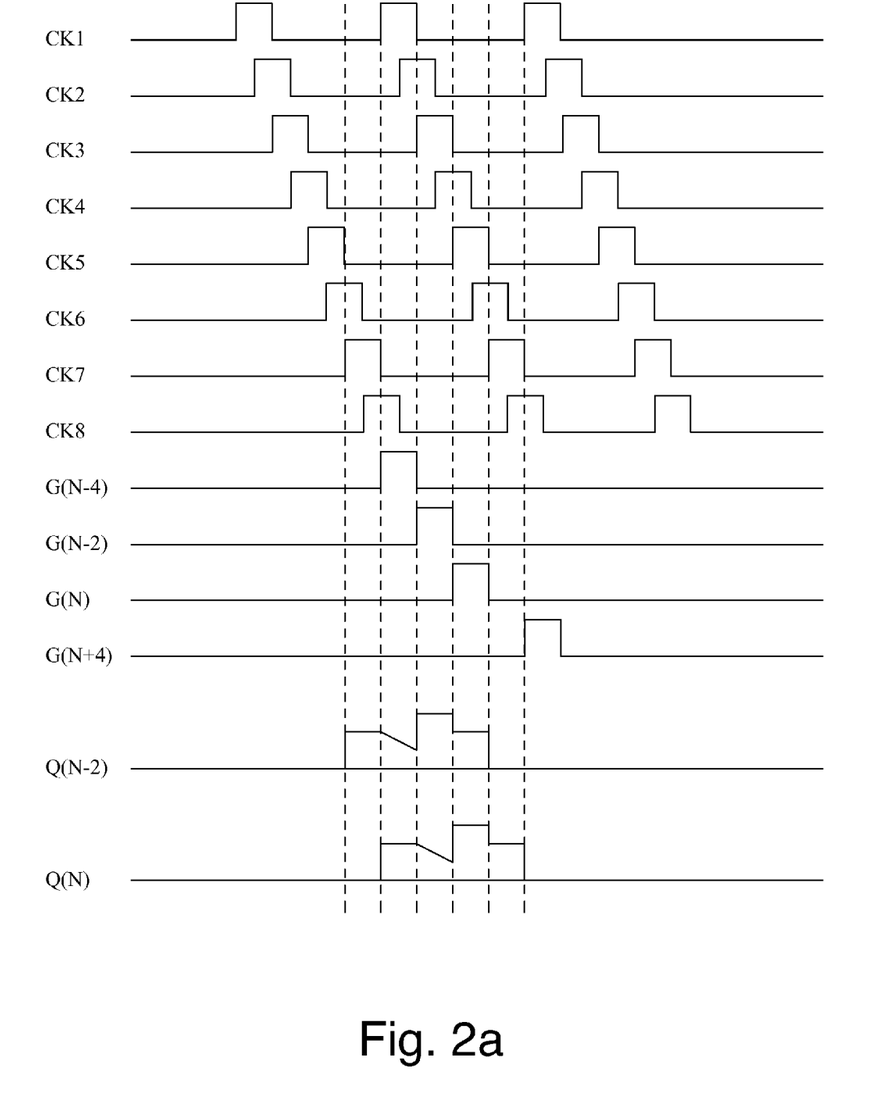
FIG. 2a is a sequence diagram of the gate driving circuit shown in FIG. 1 as performing signal transmission in 2D mode.
Figure 2B:
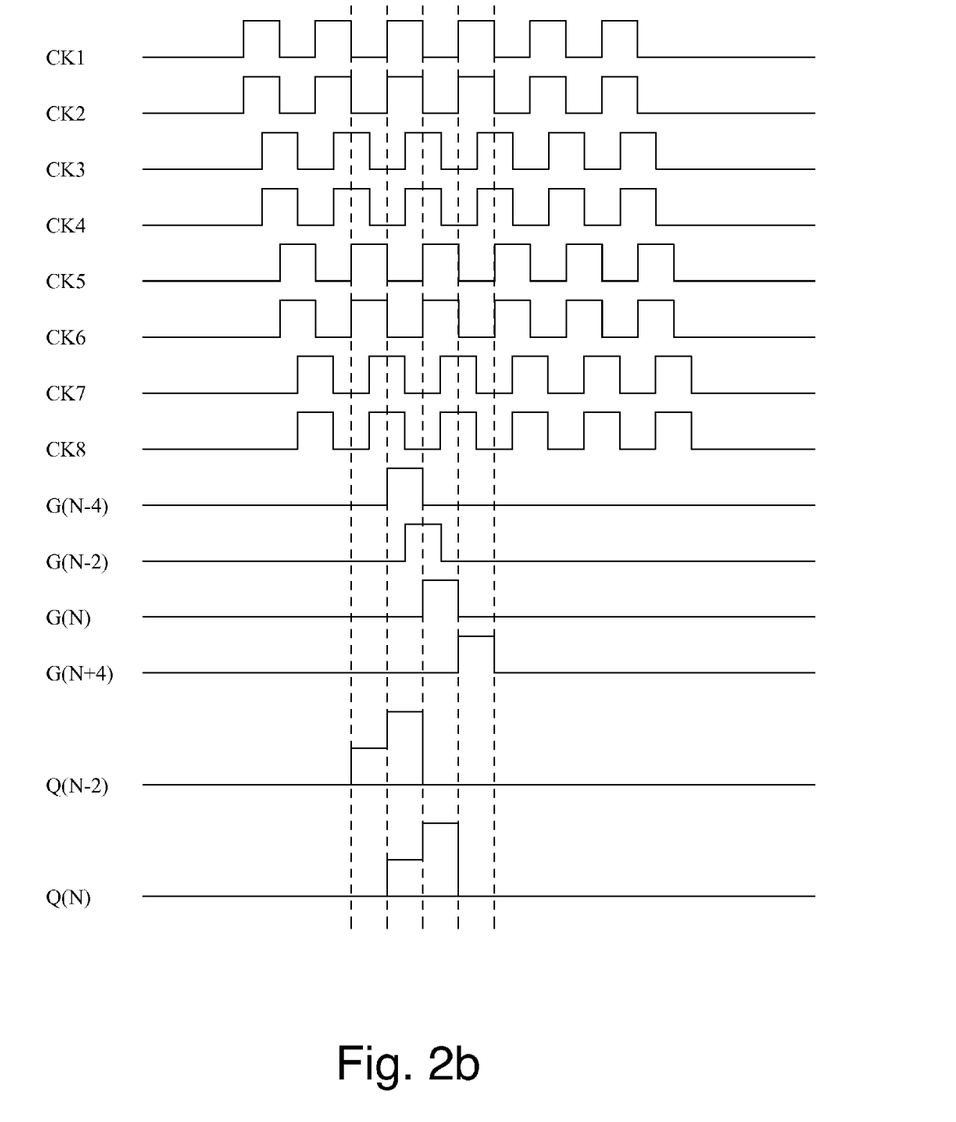
FIG. 2b is a sequence diagram of the gate driving circuit shown in FIG. 1 as performing signal transmission in 3D mode.

For a large scale panel, the signal switching between 2D display and 3D display is also required for consideration. The clock signal settings in different modes must have certain differences. Please refer to FIG. 2a, which is a sequence diagram of the gate driving circuit shown in FIG. 1 as performing signal transmission in 2D mode. The gate driving circuit employs eight high frequency clocks CK1~CK8, and two adjacent high frequency clocks are spaced a half pulse width apart. In FIG. 2a, the 1st high frequency clock CK1 corresponds to the first lifts of the N–4th horizontal scanning line G(N–4) and the gate signal point Q(N), and the 5th high frequency clock CK5 corresponds to the second lifts of the Nth horizontal scanning line G(N) and the gate signal point Q(N). In 2D mode, the signal transmission way of the eight high frequency clocks CK is that the N–4th horizontal scanning line G(N–4) transmits the signal to the Nth horizontal scanning line G(N). However, a larger time gap exist between the two signals without any signal functions, which leads to the certain leakage gap exists between the first lift and the second lift of the gate signal point Q(N). That is, the gate signal point Q(N) descends again after the gate signal point Q(N) is first lifted, which seriously influences the second bootstrap function of the gate signal point Q(N). Such leakage can be more serious if the operation is under high temperature condition and also influences the normal output of the Nth horizontal scanning line G(N). Please refer to FIG. 2b, which is a sequence diagram of the gate driving circuit shown in FIG. 1 as performing signal transmission in 3D mode. The gate driving circuit employs eight high frequency clocks CK1~CK8, and the phases of the 1th high frequency clock CK1 and the 2nd high frequency clock CK2 are the same, and the phases of the 3rd high frequency clock CK3 and the 4th high frequency clock CK4 are the same, phases of the 5th high frequency clock CK5 and the 6th high frequency clock CK6 are the same, and the phases of the 7th high frequency clock CK7 and the 8th high frequency clock CK8 are the same, and two adjacent high frequency clocks with different phases are spaced a half pulse width apart. In FIG. 2b, the 1th high frequency clock CK1 and the 2nd high frequency clock CK2 with the same phase correspond to the first lifts of the N−4th horizontal scanning line G(N−4) and the gate signal point Q(N), and the 5th high frequency clock CK5 and the 6th high frequency clock CK6 with the same phase correspond to the second lifts of the Nth horizontal scanning line G(N) and the gate signal point Q(N). In 3D mode, with the 3D image display, two high frequency clocks CK will output simultaneously. There will be no leakage gap issue under circumstance that the signal transmission remains from the N−4th horizontal scanning line G(N−4) to the Nth horizontal scanning line G(N). The gate signal point Q(N) can be normally lifted without any obvious voltage level lost.

Therefore, once the GOA skill is utilized and the signal settings in 2D mode and 3D mode is required for consideration, a special gate driving circuit solution utilizing the GOA skill needs to be designed for solving the problems below: (1) in 2D mode, the larger leakage gap existing between the signal transmissions has to be compensated; (2) in 3D mode, the special gate driving circuit solution utilizing the GOA skill cannot influence such 3D signal transmission; (3) the gate driving circuit solution utilizing the GOA skill has to be guaranteed normal working in 2D display and 3D display.

SUMMARY OF THE INVENTION

An objective of the present invention is to provide a gate driving circuit applied for 2D-3D signal setting to solve the issue caused by the leakage gap in the 2D signal transmission and meanwhile to prevent the influence to the 3D signal transmission.

For realizing the aforesaid objective, the present invention provides a gate driving circuit applied for 2D-3D signal setting, comprising: a plurality of GOA units which are cascade connected, and a Nth GOA unit controls charge to a Nth horizontal scanning line G(N) in a display area, and the Nth GOA unit comprises a pull-up controlling part, a pull-up part, a transmission part, a first pull-down part, a bootstrap capacitor part, a pull-down holding part and a pull-up compensation part; the pull-up part, the first pull-down part, the pull-down holding part and the bootstrap capacitor part are respectively coupled to a gate signal point Q(N) and the Nth horizontal scanning line G(N), and the pull-up controlling part, the transmission part and the pull-up compensation part are respectively coupled to the gate signal point Q(N), and the pull-down holding part is inputted with a DC low voltage VSS;

the pull-up controlling part comprises a first transistor T1, and the pull-up part comprises a second transistor T2, the transmission part comprises a third transistor T3, and the first pull-down part comprises a fourth transistor T4 and a fifth transistor T5, and the bootstrap capacitor part comprises a capacitor Cb; the first transistor T1 comprises a first gate g1, a first source s1 and a first drain d1, and the second transistor T2 comprises a second gate g2, a second source s2 and a second drain d2, and the third transistor T3 comprises a third gate g3, a third source s3 and a third drain d3, and the fourth transistor T4 comprises a fourth gate g4, a fourth source s4 and a fourth drain d4, and the fifth transistor T5 comprises a fifth gate g5, a fifth source s5 and a fifth drain d5;

the first gate g1 is inputted with a N−4th transmission signal ST(N−4), and the first drain d1 is electrically coupled to a N−4th horizontal scanning line G(N−4), and the first source s1 is electrically coupled to gate signal point Q(N); the second gate g2 is electrically coupled to the gate signal point Q(N), and the second drain d2 is inputted with a mth high frequency clock CK(m), and the second source s2 is electrically coupled to the Nth horizontal scanning line G(N); the third gate g3 is electrically coupled to the gate signal point Q(N), and the third drain d3 is inputted with the mth high frequency clock CK(m), and the third source s3 outputs a Nth transmission signal ST(N); the fourth gate g4 is electrically coupled to the N+4th horizontal scanning line G(N+4), and the fourth drain d4 is electrically coupled to the Nth horizontal scanning line G(N), and the fourth source s4 is inputted with the DC low voltage VSS; the fifth gate g5 is electrically coupled to the N+4th horizontal scanning line G(N+4), and the fifth drain d5 is electrically coupled to the gate signal point Q(N), and the fifth source s5 is inputted with the DC low voltage VSS; an upper electrode plate of the capacitor Cb is electrically coupled to the gate signal point and a lower electrode plate of the capacitor Cb is electrically coupled to the Nth horizontal scanning line G(N).

A signal transmission way utilized by the gate driving circuit is that the N−4th horizontal scanning line G(N−4) transmits the signal to the Nth horizontal scanning line G(N); an amount of the high frequency clocks CK are eight; all of the first transistor T1, the second transistor T2, the third transistor T3, the fourth transistor T4 and the fifth transistor T5 are thin film transistors.

In 2D mode, two adjacent high frequency clocks are spaced a half pulse width apart.

In 3D mode, the phases of the 1th high frequency clock CK1 and the 2nd high frequency clock CK2 are the same, and the phases of the 3rd high frequency clock CK3 and the 4th high frequency clock CK4 are the same, the phases of the 5th high frequency clock CK5 and the 6th high frequency clock CK6 are the same, and the phases of the 7th high frequency clock CK7 and the 8th high frequency clock CK8 are the same, and two adjacent high frequency clocks with different phases are spaced a half pulse width apart.

The pull-up compensation part comprises a sixth transistor T6, and the sixth transistor T6 comprises a sixth gate g6, a sixth source s6 and a sixth drain d6, and the sixth gate g6 is inputted with a m−2th high frequency clock CK(m−2), and the sixth drain d6 is electrically coupled to a N−2th horizontal scanning line G(N−2) or a N−2th transmission signal ST(N−2), and the sixth source s6 is employed as an output end of the pull-up compensation part to be electrically coupled to the gate signal point Q(N); a signal transmission way utilized by the gate driving circuit is that the N−4th horizontal scanning line G(N−4) transmits the signal to the Nth horizontal scanning line G(N) or that the N−4th transmission signal ST(N−4) transmits the signal to the Nth transmission signal ST(N); the sixth transistor T6 is a thin film transistor.

The pull-up compensation part comprises a sixth transistor T6' and a seventh transistor T7', and a DC control signal source DC is added; the sixth transistor T6' comprises a sixth gate g6', a sixth source s6' and a sixth drain d6', and the seventh transistor T7' comprises a seventh gate g7', a seventh source s7' and a seventh drain d7', and the sixth gate g6' is inputted with a m−2th high frequency clock CK(m−2), and the sixth drain d6' and the seventh source s7' are electrically coupled to a first circuit point D(N), and the first circuit point D(N) is an input end of the sixth transistor T6', and the sixth source s6' is employed as an output end of the pull-up compensation part to be electrically coupled to the gate signal point Q(N), and the seventh gate g7' is electrically coupled to the DC control signal source DC, and the seventh drain d7' is electrically coupled to a N−2th horizontal scanning line G(N−2) or a N−2th transmission signal ST(N−2).

The DC control signal source DC controls deactivation and activation of the pull-up compensation part, and in 2D mode, the DC control signal source DC provides a positive high voltage level to activate the pull-up compensation part, and in 3D mode, the DC control signal source DC provides a negative low voltage level to deactivate the pull-up compensation part.

A signal transmission way utilized by the gate driving circuit is that the N−4th horizontal scanning line G(N−4) transmits the signal to the Nth horizontal scanning line G(N) or that the N−4th transmission signal ST(N−4) transmits the signal to the Nth transmission signal ST(N); both the sixth transistor T6' and the seventh transistor T7' are thin film transistors.

The pull-up compensation part comprises a sixth transistor T6" and a seventh transistor T7", and a DC control signal source DC is added; the sixth transistor T6" comprises a sixth gate g6", a sixth source s6" and a sixth drain d6", and the seventh transistor T7" comprises a seventh gate g7", a seventh source s7" and a seventh drain d7", and the sixth gate g6" is electrically coupled to the DC control signal source DC, and the sixth drain d6" and the seventh source s7" are electrically coupled to a first circuit point D(N), and the first circuit point D(N) is an input end of the sixth transistor T6", and the sixth source s6" is employed as an output end of the pull-up compensation part to be electrically coupled to the gate signal point Q(N), and the seventh gate g7" is inputted with a m−2th high frequency clock CK(m−2), and the seventh drain d7" is electrically coupled to a N−2th horizontal scanning line G(N−2) or a N−2th transmission signal ST(N−2).

The DC control signal source DC controls deactivation and activation of the pull-up compensation part, and in 2D mode, the DC control signal source DC provides a positive high voltage level to activate the pull-up compensation part, and in 3D mode, the DC control signal source DC provides a negative low voltage level to deactivate the pull-up compensation part.

A signal transmission way utilized by the gate driving circuit is that the N−4th horizontal scanning line G(N−4) transmits the signal to the Nth horizontal scanning line G(N) or that the N−4th transmission signal ST(N−4) transmits the signal to the Nth transmission signal ST(N); both the sixth transistor T6" and the seventh transistor T7" are thin film transistors.

The present invention further provides a gate driving circuit applied for 2D-3D signal setting, comprising: a plurality of GOA units which are cascade connected, and a Nth GOA unit controls charge to a Nth horizontal scanning line G(N) in a display area, and the Nth GOA unit comprises a pull-up controlling part, a pull-up part, a transmission part, a first pull-down part, a bootstrap capacitor part, a pull-down holding part and a pull-up compensation part; the pull-up part, the first pull-down part, the pull-down holding part and the bootstrap capacitor part are respectively coupled to a gate signal point Q(N) and the Nth horizontal scanning line G(N), and the pull-up controlling part, the transmission part and the pull-up compensation part are respectively coupled to the gate signal point Q(N), and the pull-down holding part is inputted with a DC low voltage VSS;

the pull-up controlling part comprises a first transistor T1, and the pull-up part comprises a second transistor T2, the transmission part comprises a third transistor T3, and the first pull-down part comprises a fourth transistor T4 and a fifth transistor T5, and the bootstrap capacitor part comprises a capacitor Cb; the first transistor T1 comprises a first gate g1, a first source s1 and a first drain d1, and the second transistor T2 comprises a second gate g2, a second source s2 and a second drain d2, and the third transistor T3 comprises a third gateg3, a third source s3 and a third drain d3, and the fourth transistor T4 comprises a fourth gate g4, a fourth source s4 and a fourth drain d4, and the fifth transistor T5 comprises a fifth gate g5, a fifth source s5 and a fifth drain d5;

the first gate g1 is inputted with a N−4th transmission signal ST(N−4), and the first drain d1 is electrically coupled to a N−4th horizontal scanning line G(N−4), and the first source s1 is electrically coupled to gate signal point Q(N); the second gate g2 is electrically coupled to the gate signal point Q(N), and the second drain d2 is inputted with a mth high frequency clock CK(m), and the second source s2 is electrically coupled to the Nth horizontal scanning line G(N); the third gate g3 is electrically coupled to the gate signal point Q(N), and the third drain d3 is inputted with the mth high frequency clock CK(m), and the third source s3 outputs a Nth transmission signal ST(N); the fourth gate g4 is electrically coupled to the N+4th horizontal scanning line G(N+4), and the fourth drain d4 is electrically coupled to the Nth horizontal scanning line G(N), and the fourth source s4 is inputted with the DC low voltage VSS; the fifth gate g5 is electrically coupled to the N+4th horizontal scanning line G(N+4), and the fifth drain d5 is electrically coupled to the gate signal point Q(N), and the fifth source s5 is inputted with the DC low voltage VSS; an upper electrode plate of the capacitor Cb is electrically coupled to the gate signal point and a lower electrode plate of the capacitor Cb is electrically coupled to the Nth horizontal scanning line G(N);

a signal transmission way utilized by the gate driving circuit is that the N−4th horizontal scanning line G(N−4) transmits the signal to the Nth horizontal scanning line G(N); an amount of the high frequency clocks CK are eight; all of the first transistor T1, the second transistor T2, the third transistor T3, the fourth transistor T4 and the fifth transistor T5 are thin film transistors;

in 2D mode, two adjacent high frequency clocks are spaced a half pulse width apart;

in 3D mode, phases of the 1th high frequency clock CK1 and the 2nd high frequency clock CK2 are the same, and the phases of the 3rd high frequency clock CK3 and the 4th high frequency clock CK4 are the same, phases of the 5th high frequency clock CK5 and the 6th high frequency clock CK6 are the same, and the phases of the 7th high frequency clock CK7 and the 8th high frequency clock CK8 are the same, and two adjacent high frequency clocks with different phases are spaced a half pulse width apart;

the pull-up compensation part comprises a sixth transistor T6, and the sixth transistor T6 comprises a sixth gate g6, a sixth source s6 and a sixth drain d6, and the sixth gate g6 is inputted with a m−2th high frequency clock CK(m−2), and the sixth drain d6 is electrically coupled to a N−2th horizontal scanning line G(N−2) or a N−2th transmission signal ST(N−2), and the sixth source s6 is employed as an output end of the pull-up compensation part to be electrically coupled to the gate signal point Q(N); a signal transmission way utilized by the gate driving circuit is that the N−4th horizontal scanning line G(N−4) transmits the signal to the Nth horizontal scanning line G(N) or that the N−4th transmission signal ST(N−4) transmits the signal to the Nth transmission signal ST(N); the sixth transistor T6 is a thin film transistor.

The benefits of the present invention are: the present invention provides a gate driving circuit applied for 2D-3D signal setting. On the basis of the gate driving circuit utilizing the present GOA skill, the present invention adds a pull-up compensation part. The main function of the pull-up compensation part is to compensate the leakage gap existing in the 2D signal transmission to ensure that the voltage level of the gate signal point Q(N) will not descend in leakage gap period; by introducing an additional DC control signal source DC to control the activation and deactivation of the pull-up compensation part for activating it in 2D mode to realize compensation and deactivating it in 3D mode to prevent the influence to the 3D signal transmission. The pull-up compensation part can be effectively controlled.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution, as well as beneficial advantages, of the present invention will be apparent from the following detailed description of an embodiment of the present invention, with reference to the attached drawings.

In drawings.

DETAILED DESCRIPTION OF PREFERRED EMBODIMENTS

Embodiments of the present invention are described in detail with the technical matters, structural features, achieved objects, and effects with reference to the accompanying drawings as follows.

Figure 3:
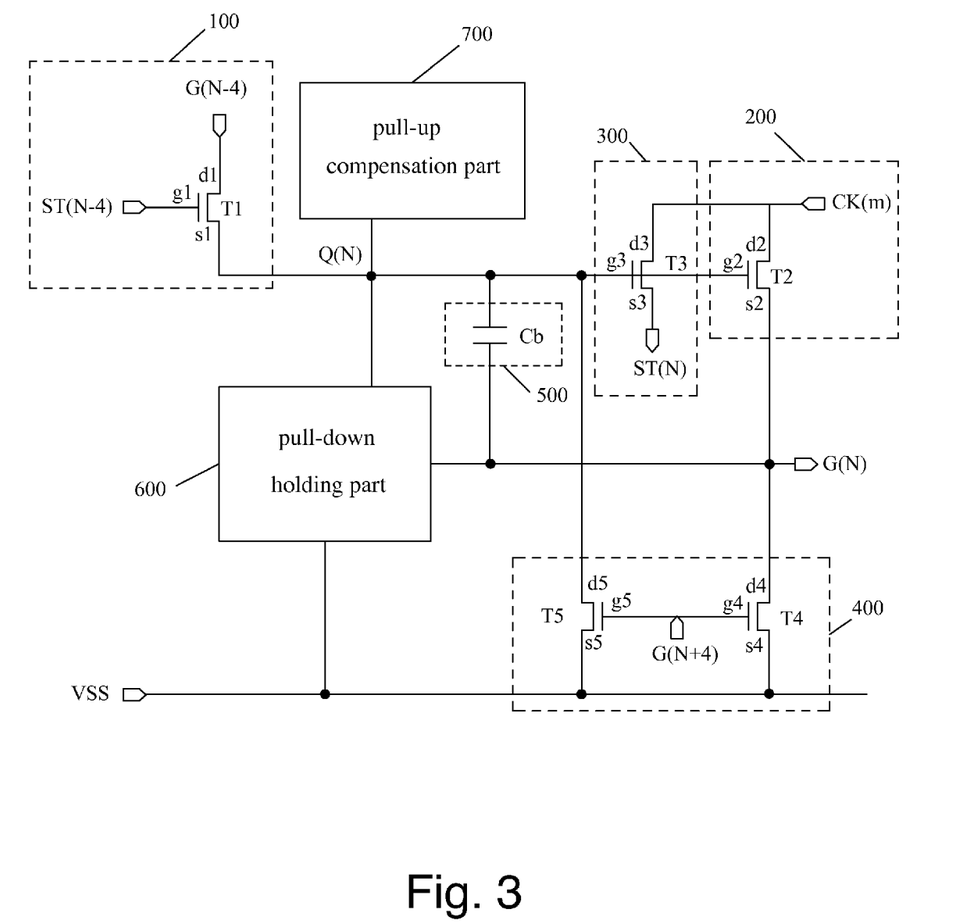
FIG. 3 is a structural diagram of a gate driving circuit applied for 2D-3D signal setting according to the present invention.

Please refer to FIG. 3, which is a structural diagram of a gate driving circuit applied for 2D-3D signal setting according to the present invention comprising: a plurality of GOA units which are cascade connected, and a Nth GOA unit controls charge to a Nth horizontal scanning line G(N) in a display area, and the Nth GOA unit comprises a pull-up controlling part 100, a pull-up part 200, a transmission part 300, a first pull-down part 400, a bootstrap capacitor part 500, a pull-down holding part 600 and a pull-up compensation part 700; the pull-up part 200, the first pull-down part 400, the pull-down holding part 600 and the bootstrap capacitor part 500 are respectively coupled to a gate signal point Q(N) and the Nth horizontal scanning line G(N), and the pull-up controlling part 100, the transmission part 300 and the pull-up compensation part 700 are respectively coupled to the gate signal point Q(N), and the pull-down holding part 600 is inputted with a DC low voltage VSS. The pull-up controlling part 100 comprises a first transistor T1, and the pull-up part 200 comprises a second transistor T2, the transmission part 300 comprises a third transistor T3, and the first pull-down part 400 comprises a fourth transistor T4 and a fifth transistor T5, and the bootstrap capacitor part 500 comprises a capacitor Cb; the first transistor T1 comprises a first gate g1, a first source s1 and a first drain d1, and the second transistor T2 comprises a second gate g2, a second source s2 and a second drain d2, and the third transistor T3 comprises a third gate g3, a third source s3 and a third drain d3, and the fourth transistor T4 comprises a fourth gate g4, a fourth source s4 and a fourth drain d4, and the fifth transistor T5 comprises a fifth gate g5, a fifth source s5 and a fifth drain d5; the first gate g1 is inputted with a N−4th transmission signal ST(N−4), and the first drain d1 is electrically coupled to a N−4th horizontal scanning line G(N−4), and the first source s1 is electrically coupled to gate signal point Q(N); the second gate g2 is electrically coupled to the gate signal point Q(N), and the second drain d2 is inputted with a mth high frequency clock CK(m), and the second source s2 is electrically coupled to the Nth horizontal scanning line G(N); the third gate g3 is electrically coupled to the gate signal point Q(N), and the third drain d3 is inputted with the mth high frequency clock CK(m), and the third source s3 outputs a Nth transmission signal ST(N); the fourth gate g4 is electrically coupled to the N+4th horizontal scanning line G(N+4), and the fourth drain d4 is electrically coupled to the Nth horizontal scanning line G(N), and the fourth source s4 is inputted with the DC low voltage VSS; the fifth gate g5 is electrically coupled to the N+4th horizontal scanning line G(N+4), and the fifth drain d5 is electrically coupled to the gate signal point Q(N), and the fifth source s5 is inputted with the DC low voltage VSS; an upper electrode plate of the capacitor Cb is electrically coupled to the gate signal point and a lower electrode plate of the capacitor Cb is electrically coupled to the Nth horizontal scanning line G(N); All of the first transistor T1, the second transistor T2, the third transistor T3, the fourth transistor T4 and the fifth transistor T5 are thin film transistors. The pull-up compensation part 700 is capable of compensating the leakage gap in 2D mode to ensure that the voltage level will not descend after the gate signal point Q(N) is first lifted.

Figure 4:
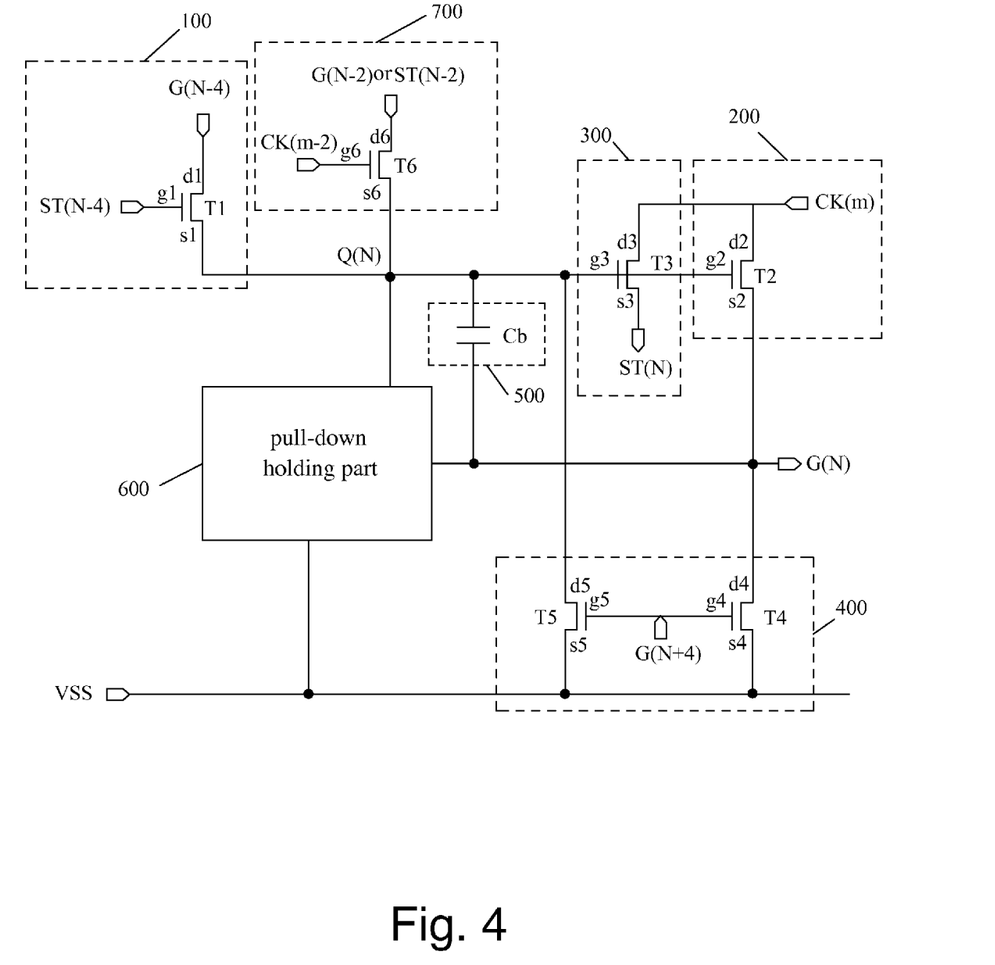
FIG. 4 is a circuit diagram of the first embodiment of gate driving circuit shown in FIG. 3.

Please refer to FIG. 4 in conjunction with FIG. 3. FIG. 4 is a circuit diagram of the first embodiment of gate driving circuit shown in FIG. 3. In the first embodiment, a first design is performed to the pull-up compensation part 700 shown in FIG. 3. The pull-up compensation part 700 of this embodiment comprises a sixth transistor T6, and the sixth transistor T6 comprises a sixth gate g6, a sixth source s6 and a sixth drain d6, and the sixth transistor T6 is a thin film transistor. The sixth gate g6 is inputted with a m−2th high frequency clock CK(m−2), and the sixth drain d6 is electrically coupled to a N−2th horizontal scanning line G(N−2) or a N−2th transmission signal ST(N−2), and the sixth source s6 is employed as an output end of the pull-up compensation part to be electrically coupled to the gate signal point Q(N), and the N−2th horizontal scanning line G(N−2) can be employed to compensate a transmission gap between the N−4th horizontal scanning line G(N−4) and the Nth horizontal scanning line G(N), or the N−2th transmission signal ST(N−2) can be employed to compensate a transmission gap between the N−4th transmission signal ST(N−4) and the Nth transmission signal ST(N). In this embodiment and in 2D mode, the leakage gap existing in the 2D signal transmission can be compensated to ensure that the voltage level of the gate signal point Q(N) will not descend in leakage gap period. However, in 3D mode, the pull-up compensation part cannot be normally deactivated. In worse scenario, the bootstrap function of the gate signal point Q(N) in 3D mode can be influenced.

Figure 5:
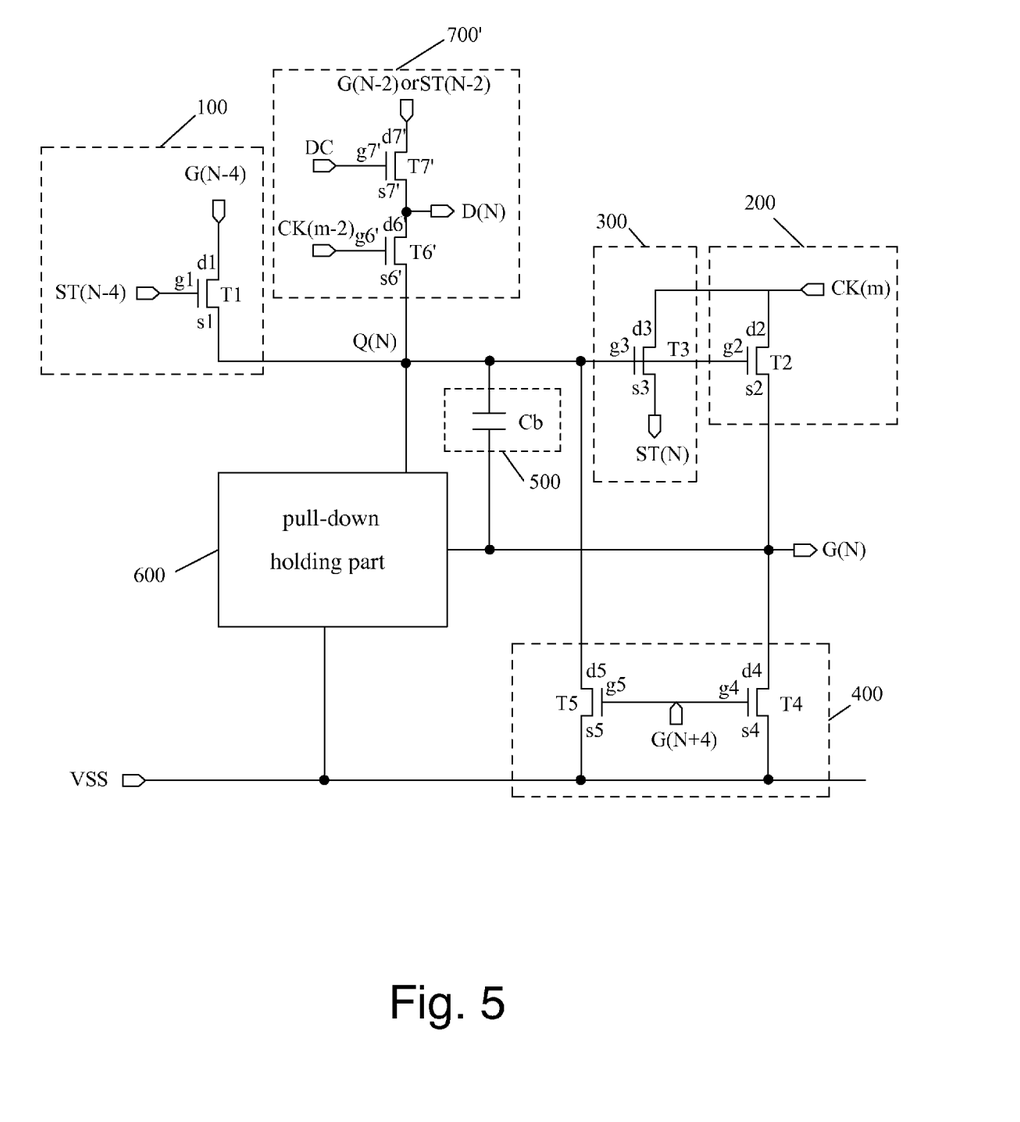
FIG. 5 is a circuit diagram of the second embodiment of gate driving circuit shown in FIG. 3.

Please refer to FIG. 5 in conjunction with FIG. 3. FIG. 5 is a circuit diagram of the second embodiment of gate driving circuit shown in FIG. 3. In the second embodiment, a second design is performed to the pull-up compensation part 700' shown in FIG. 3. The pull-up compensation part 700' of this embodiment comprises a sixth transistor T6' and a seventh transistor T7', and a DC control signal source DC is added, and the DC control signal source DC controls the deactivation and the activation of the pull-up compensation part 700'; Both the sixth transistor T6' and the seventh transistor T7' are thin film transistors, and the sixth transistor T6' comprises a sixth gate g6', a sixth source s6' and a sixth drain d6', and the seventh transistor T7' comprises a seventh gate g7', a seventh source s7' and a seventh drain d7'; the sixth gate g6' is inputted with a m−2th high frequency clock CK(m−2), and the sixth drain d6' and the seventh source s7' are electrically coupled to a first circuit point D(N), and the first circuit point D(N) is an input end of the sixth transistor T6'; the sixth source s6' is employed as an output end of the pull-up compensation part 700' to be electrically coupled to the gate signal point Q(N), and the seventh gate g7' is electrically coupled to the DC control signal source DC, and the seventh drain d7' is electrically coupled to a N−2th horizontal scanning line G(N−2) or a N−2th transmission signal ST(N−2); In such design, the N−2th horizontal scanning line G(N−2) can be employed to compensate a transmission gap between the N−4th horizontal scanning line G(N−4) and the Nth horizontal scanning line G(N), or the N−2th transmission signal ST(N−2) can be employed to compensate a transmission gap between the N−4th transmission signal ST(N−4) and the Nth transmission signal ST(N). Meanwhile, it can be ensured that in 2D mode, the DC control signal source DC provides a positive high voltage level to activate the pull-up compensation part 700' and in 3D mode, the DC control signal source DC provides a negative low voltage level to deactivate the pull-up compensation part 700'. Accordingly, the compensation is accomplished and the influence of the pull-up compensation part 700' to the 3D signal transmission can be prevented.

Figure 6:
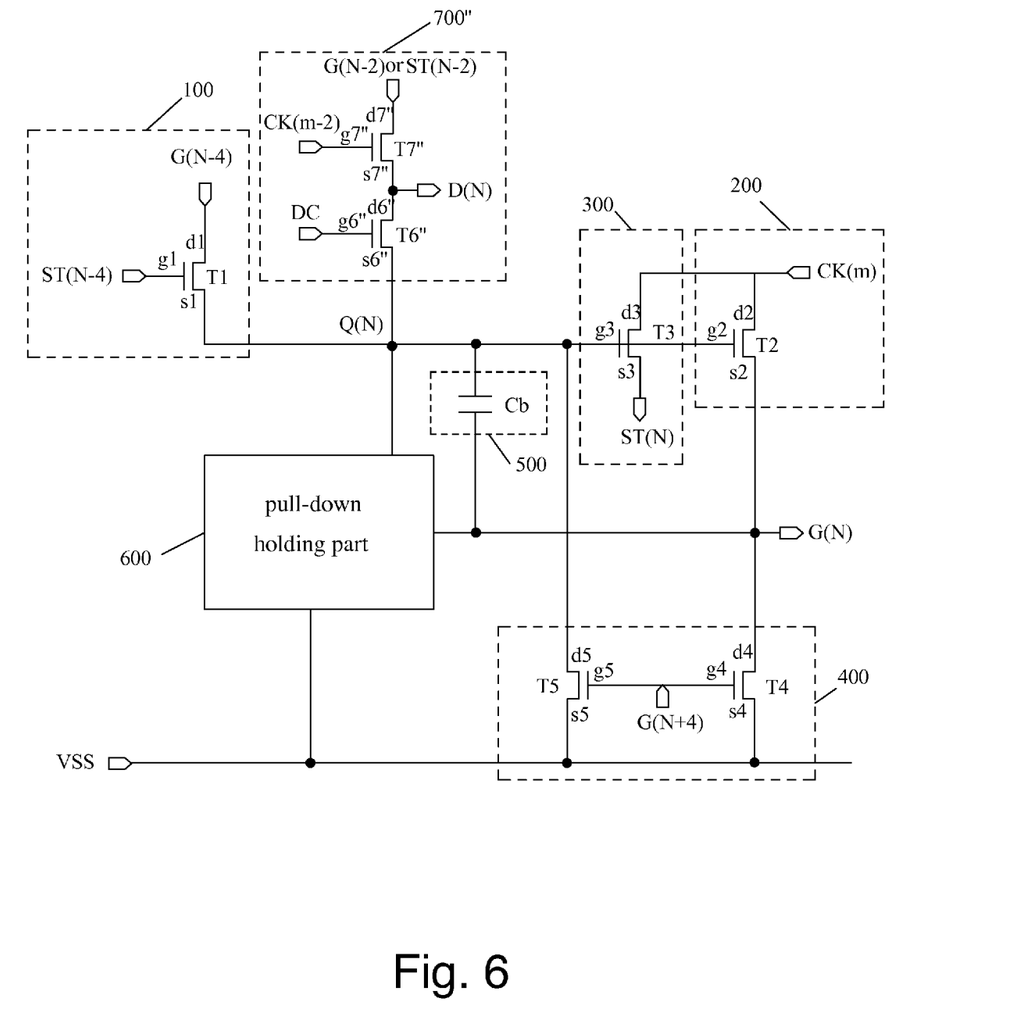
FIG. 6 is a circuit diagram of the third embodiment of gate driving circuit shown in FIG. 3.

Please refer to FIG. 6 in conjunction with FIG. 3. FIG. 6 is a circuit diagram of the third embodiment of gate driving circuit shown in FIG. 3. In the third embodiment, a third design is performed to the pull-up compensation part 700" shown in FIG. 3. The pull-up compensation part 700" of this embodiment comprises a sixth transistor T6" and a seventh transistor T7", and a DC control signal source DC is added, and the DC control signal source DC controls the deactivation and the activation of the pull-up compensation part 700"; Both the sixth transistor T6" and the seventh transistor T7" are thin film transistors, and the sixth transistor T6" comprises a sixth gate g6", a sixth source s6" and a sixth drain d6", and the seventh transistor T7" comprises a seventh gate g7", a seventh source s7" and a seventh drain d7"; the sixth gate g6" is electrically coupled to the DC control signal source DC, and the sixth drain d6" and the seventh source s7" are electrically coupled to a first circuit point D(N), and the first circuit point D(N) is an input end of the sixth transistor T6", and the sixth source s6" is employed as an output end of the pull-up compensation part to be electrically coupled to the gate signal point Q(N), and the seventh gate g7" is inputted with a m−2th high frequency clock CK(m−2), and the seventh drain d7" is electrically coupled to a N−2th horizontal scanning line G(N−2) or a N−2th transmission signal ST(N−2). This embodiment can provide the same compensation result as the same as the second embodiment does and without the influence to the 3D signal transmission.

As shown in FIG. 4, FIG. 5 and FIG. 6, the pull-up compensation part 700 of the first embodiment compensates the leakage gap with a transistor. Such design can only compensate the leakage gap existing in the 2D signal transmission in 2D mode to ensure that the voltage level of the gate signal point Q(N) will not descend in leakage gap period; the pull-up compensation part 700' of the second embodiment and the pull-up compensation part 700" of the third embodiment both utilize two transistors with an additional DC control signal source DC which is introduced to control the deactivation and activation of the pull-up compensation part 700' or 700". Accordingly, it is guaranteed that the pull-up compensation part 700' or 700" is activated and the compensation is accomplished in 2D mode; the pull-up compensation part 700' or 700" is deactivated and the influence to the 3D signal transmission can be prevented. The difference between the second embodiment and the third embodiment is that in the second embodiment, the gate g6' of the sixth transistor T6' is inputted with the m−2th high frequency clock CK(m−2), and the seventh gate g7' of the seventh transistor T7' is inputted with the DC control signal source DC; in the third embodiment, the gate g6' of the sixth transistor T6' is inputted with the DC control signal source DC, and the seventh gate g7' of the seventh transistor T7' is inputted with the m−2th high frequency clock CK(m−2).

Figure 7:
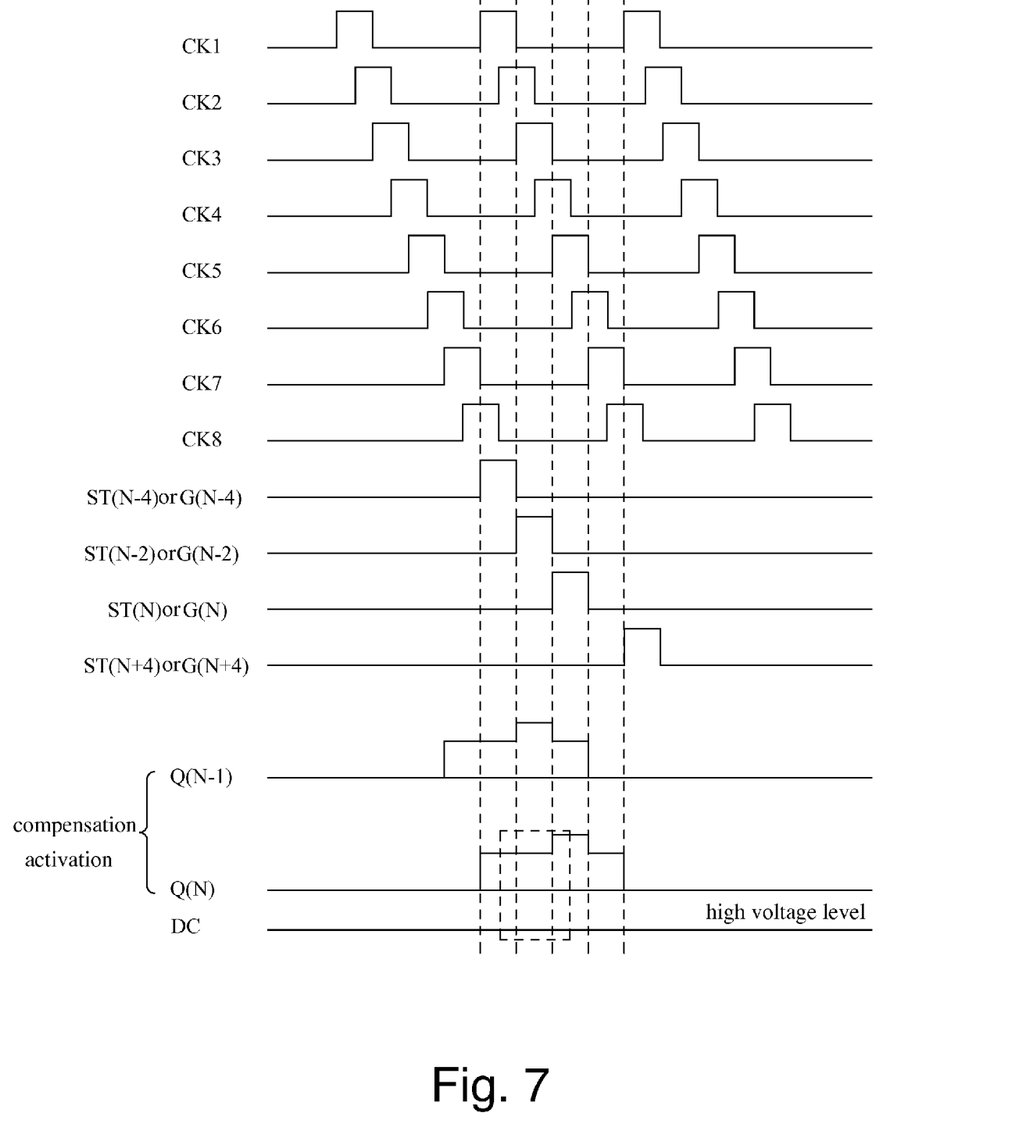
FIG. 7 is a sequence diagram of the gate driving circuit shown in FIG. 5 and FIG. 6 in 2D mode.

Please refer to FIG. 7 in conjunction with FIG. 2a. FIG. 7 is a sequence diagram of the gate driving circuit shown in FIG. 5 and FIG. 6 in 2D mode. The GOA circuit employs eight high frequency clocks CK1~CK8, and two adjacent high frequency clocks are spaced a half pulse width apart. Specifically, it reveals the working procedure of the present invention in 2D mode: the 1st high frequency clock CK1 corresponds to the first lifts of the N−4th horizontal scanning line G(N−4) or the N−4th transmission signal ST(N−4), and the gate signal point Q(N), and the 5th high frequency clock CK5 corresponds to the second lifts of the Nth horizontal scanning line G(N) or the Nth transmission signal ST(N), and the gate signal point Q(N); the 3rd high frequency clock CK3 corresponds to the N−2th horizontal scanning line G(N−2) or the N−2th transmission signal ST(N−2) to compensate the transmission gap between the N−4th horizontal scanning line G(N−4) and the Nth horizontal scanning line G(N) or the transmission gap between the N−4th transmission signal ST(N−4) and the Nth transmission signal ST(N) to ensure that the voltage level of the gate signal point Q(N) (the position that the dot lines indicates in FIG. 7) will not descend in leakage gap period. In comparison with FIG. 2*a*, the voltage level descend will not occur to the waveform of the gate signal point Q(N) in the leakage gap period because the function of the pull-up compensation part 700' or 700". At this moment, the DC control signal source DC is required to provide a positive high voltage level to activate the pull-up compensation part 700' or 700".

Figure 8:
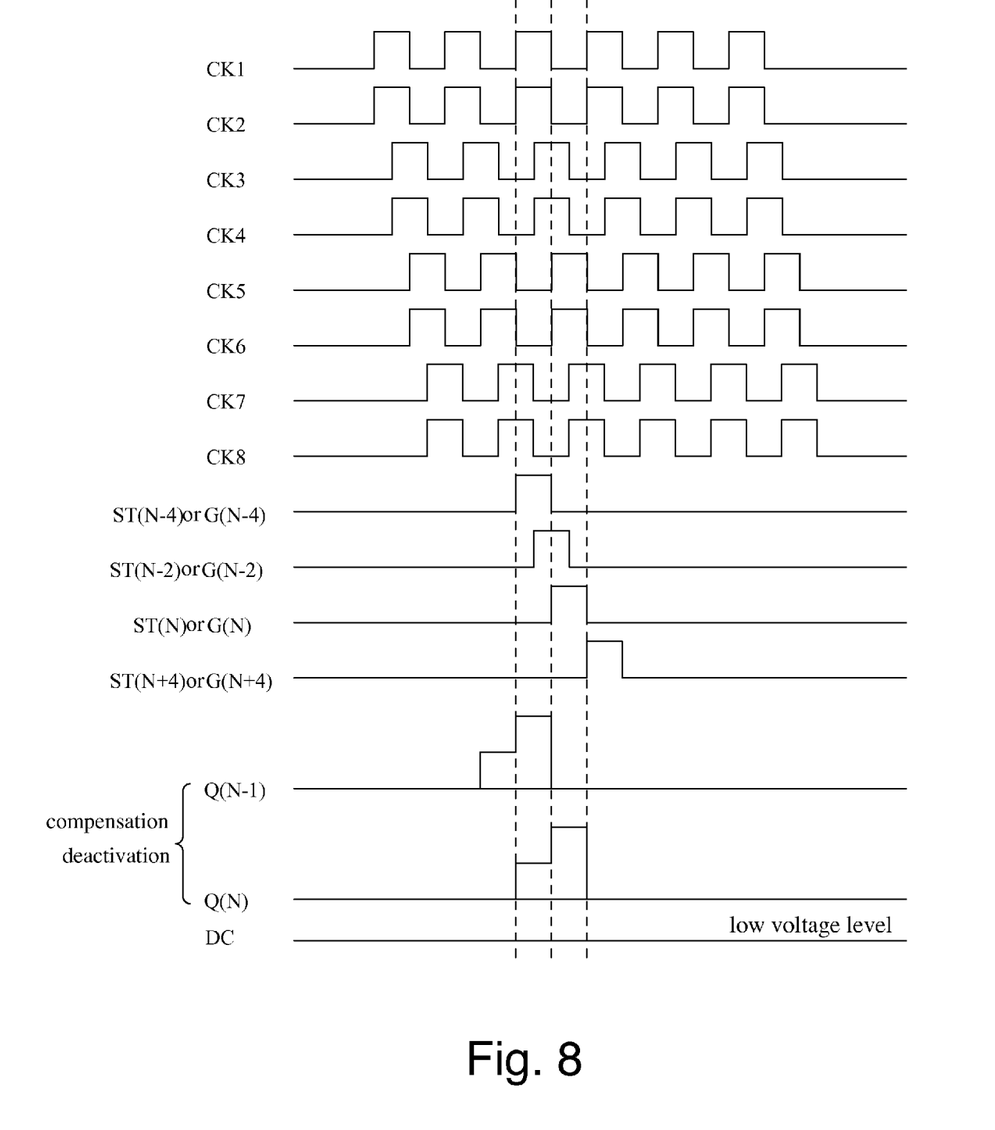
FIG. 8 is a sequence diagram of the gate driving circuit shown in FIG. 5 and FIG. 6 in 3D mode.

Please refer to FIG. 8, which is a sequence diagram of the gate driving circuit shown in FIG. 5 and FIG. 6 in 3D mode. The GOA circuit employs eight high frequency clocks CK1~CK8, and the phases of the 1th high frequency clock CK1 and the 2nd high frequency clock CK2 are the same, and the phases of the 3rd high frequency clock CK3 and the 4th high frequency clock CK4 are the same, phases of the 5th high frequency clock CK5 and the 6th high frequency clock CK6 are the same, and the phases of the 7th high frequency clock CK7 and the 8th high frequency clock CK8 are the same, and two adjacent high frequency clocks with different phases are spaced a half pulse width apart. Specifically, it reveals the working procedure of the present invention in 3D mode: the 1th high frequency clock CK1 and the 2nd high frequency clock CK2 with the same phase correspond to the first lifts of the N−4th horizontal scanning line G(N−4) or the N−4th transmission signal ST(N−4), and the gate signal point Q(N), the 5th high frequency clock CK5 and the 6th high frequency clock CK6 with the same phase correspond to the second lifts of the Nth horizontal scanning line G(N) or the Nth transmission signal ST(N) for ensuring that the pull-up compensation part 700' or 700" is deactivated, and the DC control signal source DC is required to provide a negative low voltage level. Under such circumstance, the pull-up compensation part 700' or 700" is effectively deactivated and the 3D signal transmission will not be influenced by the pull-up compensation part 700' or 700".

In conclusion, the present invention provides a gate driving circuit applied for 2D-3D signal setting. On the basis of the gate driving circuit utilizing the present GOA skill, the present invention adds a pull-up compensation part. The main function of the pull-up compensation part is to compensate the leakage gap existing in the 2D signal transmission to ensure that the voltage level of the gate signal point Q(N) will not descend in leakage gap period; by introducing an additional DC control signal source DC to control the activation and deactivation of the pull-up compensation part for activating it in 2D mode to realize compensation and deactivating it in 3D mode to prevent the influence to the 3D signal transmission. The pull-up compensation part can be effectively controlled.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A gate driving circuit applied for 2D-3D signal setting, comprising: a plurality of gate driver on array units which are cascade connected, and a Nth gate driver on array unit controls charge to a Nth horizontal scanning line in a display area, and the Nth gate driver on array unit comprises a pull-up controlling part, a pull-up part, a transmission part, a first pull-down part, a bootstrap capacitor part, a pull-down holding part and a pull-up compensation part; the pull-up part, the first pull-down part, the pull-down holding part and the bootstrap capacitor part are respectively coupled to a gate signal point and the Nth horizontal scanning line, and the pull-up controlling part, the transmission part and the pull-up compensation part are respectively coupled to the gate signal point, and the pull-down holding part is inputted with a DC low voltage;

the pull-up controlling part comprises a first transistor, and the pull-up part comprises a second transistor, the transmission part comprises a third transistor, and the first pull-down part comprises a fourth transistor and a fifth transistor, and the bootstrap capacitor part comprises a capacitor; the first transistor comprises a first gate, a first source and a first drain, and the second transistor comprises a second gate, a second source and a second drain, and the third transistor comprises a third gate, a third source and a third drain, and the fourth transistor comprises a fourth gate, a fourth source and a fourth drain, and the fifth transistor comprises a fifth gate, a fifth source and a fifth drain;

the first gate is inputted with a N−4th transmission signal, and the first drain is electrically coupled to a N−4th horizontal scanning line, and the first source is electrically coupled to gate signal point; the second gate is electrically coupled to the gate signal point, and the second drain is inputted with a mth high frequency clock, and the second source is electrically coupled to the Nth horizontal scanning line; the third gate is electrically coupled to the gate signal point, and the third drain is inputted with the mth high frequency clock, and the third source outputs a Nth transmission signal; the fourth gate is electrically coupled to the N+4th horizontal scanning line, and the fourth drain is electrically coupled to the Nth horizontal scanning line, and the fourth source is inputted with the DC low voltage; the fifth gate is electrically coupled to the N+4th horizontal scanning line, and the fifth drain is electrically coupled to the gate signal point, and the fifth source is inputted with the DC low voltage; an upper electrode plate of the capacitor is electrically coupled to the gate signal point and a lower electrode plate of the capacitor is electrically coupled to the Nth horizontal scanning line.

2. The gate driving circuit applied for 2D-3D signal setting according to claim 1, wherein a signal transmission way utilized by the gate driving circuit is that the N−4th horizontal scanning line transmits the signal to the Nth horizontal scanning line; an amount of the high frequency clocks are eight; all of the first transistor, the second transistor, the third transistor, the fourth transistor and the fifth transistor are thin film transistors.

3. The gate driving circuit applied for 2D-3D signal setting according to claim 2, wherein in 2D mode, two adjacent high frequency clocks are spaced a half pulse width apart.

4. The gate driving circuit applied for 2D-3D signal setting according to claim 2, wherein in 3D mode, phases of the 1th high frequency clock and the 2nd high frequency clock are the same, and the phases of the 3rd high frequency clock and the 4th high frequency clock are the same, phases of the 5th high frequency clock and the 6th high frequency clock are the same, and the phases of the 7th high frequency clock and the 8th high frequency clock are the same, and two adjacent high frequency clocks with different phases are spaced a half pulse width apart.

5. The gate driving circuit applied for 2D-3D signal setting according to claim 1, wherein the pull-up compensation part comprises a sixth transistor, and the sixth transistor comprises a sixth gate, a sixth source and a sixth drain, and the sixth gate is inputted with a m−2th high frequency clock, and the sixth drain is electrically coupled to a N−2th horizontal scanning line or a N−2th transmission signal, and the sixth source is employed as an output end of the pull-up compensation part to be electrically coupled to the gate signal point; a signal transmission way utilized by the gate driving circuit is that the N−4th horizontal scanning line transmits the signal to the Nth horizontal scanning line or that the N−4th transmission signal transmits the signal to the Nth transmission signal; the sixth transistor is a thin film transistor.

6. The gate driving circuit applied for 2D-3D signal setting according to claim 1, wherein the pull-up compensation part comprises a sixth transistor and a seventh transistor, and a DC control signal source is added; the sixth transistor comprises a sixth gate, a sixth source and a sixth drain, and the seventh transistor comprises a seventh gate, a seventh source and a seventh drain, and the sixth gate is inputted with a m−2th high frequency clock, and the sixth drain and the seventh source are electrically coupled to a first circuit point, and the first circuit point is an input end of the sixth transistor, and the sixth source is employed as an output end of the pull-up compensation part to be electrically coupled to the gate signal point, and the seventh gate is electrically coupled to the DC control signal source, and the seventh drain is electrically coupled to a N−2th horizontal scanning line or a N−2th transmission signal.

7. The gate driving circuit applied for 2D-3D signal setting according to claim 6, wherein the DC control signal source controls deactivation and activation of the pull-up compensation part, and in 2D mode, the DC control signal source provides a positive high voltage level to activate the pull-up compensation part, and in 3D mode, the DC control signal source provides a negative low voltage level to deactivate the pull-up compensation part.

8. The gate driving circuit applied for 2D-3D signal setting according to claim 6, wherein a signal transmission way utilized by the gate driving circuit is that the N−4th horizontal scanning line transmits the signal to the Nth horizontal scanning line or that the N−4th transmission signal transmits the signal to the Nth transmission signal; both the sixth transistor and the seventh transistor are thin film transistors.

9. The gate driving circuit applied for 2D-3D signal setting according to claim 1, wherein the pull-up compensation part comprises a sixth transistor and a seventh transistor, and a DC control signal source is added; the sixth transistor comprises a sixth gate, a sixth source and a sixth drain, and the seventh transistor comprises a seventh gate, a seventh source and a seventh drain; the sixth gate is electrically coupled to the DC control signal source, and the sixth drain and the seventh source are electrically coupled to a first circuit point, and the first circuit point is an input end of the sixth transistor, and the sixth source is employed as an output end of the pull-up compensation part to be electrically coupled to the gate signal point, and the seventh gate is inputted with a m−2th high frequency clock, and the seventh drain is electrically coupled to a N−2th horizontal scanning line or a N−2th transmission signal.

10. The gate driving circuit applied for 2D-3D signal setting according to claim 9, wherein the DC control signal source controls deactivation and activation of the pull-up compensation part, and in 2D mode, the DC control signal source provides a positive high voltage level to activate the pull-up compensation part, and in 3D mode, the DC control signal source provides a negative low voltage level to deactivate the pull-up compensation part.

11. The gate driving circuit applied for 2D-3D signal setting according to claim 9, wherein a signal transmission way utilized by the gate driving circuit is that the N−4th horizontal scanning line transmits the signal to the Nth horizontal scanning line or that the N−4th transmission signal transmits the signal to the Nth transmission signal; both the sixth transistor and the seventh transistor are thin film transistors.

12. A gate driving circuit applied for 2D-3D signal setting, comprising: a plurality of gate driver on array units which are cascade connected, and a Nth gate driver on array unit controls charge to a Nth horizontal scanning line in a display area, and the Nth gate driver on array unit comprises a pull-up controlling part, a pull-up part, a transmission part, a first pull-down part, a bootstrap capacitor part, a pull-down holding part and a pull-up compensation part; the pull-up part, the first pull-down part, the pull-down holding part and the bootstrap capacitor part are respectively coupled to a gate signal point and the Nth horizontal scanning line, and the pull-up controlling part, the transmission part and the pull-up compensation part are respectively coupled to the gate signal point, and the pull-down holding part is inputted with a DC low voltage;

the pull-up controlling part comprises a first transistor, and the pull-up part comprises a second transistor, the transmission part comprises a third transistor, and the first pull-down part comprises a fourth transistor and a fifth transistor, and the bootstrap capacitor part comprises a capacitor; the first transistor comprises a first gate, a first source and a first drain, and the second transistor comprises a second gate, a second source and a second drain, and the third transistor comprises a third gate, a third source and a third drain, and the fourth transistor comprises a fourth gate, a fourth source and a fourth drain, and the fifth transistor comprises a fifth gate, a fifth source and a fifth drain;

the first gate is inputted with a N−4th transmission signal, and the first drain is electrically coupled to a N−4th horizontal scanning line, and the first source is electrically coupled to gate signal point; the second gate is electrically coupled to the gate signal point, and the second drain is inputted with a mth high frequency clock, and the second source is electrically coupled to the Nth horizontal scanning line; the third gate is electrically coupled to the gate signal point, and the third drain is inputted with the mth high frequency clock, and the third source outputs a Nth transmission signal; the fourth gate is electrically coupled to the N+4th horizontal scanning line, and the fourth drain is electrically coupled to the Nth horizontal scanning line, and the fourth source is inputted with the DC low voltage; the fifth gate is electrically coupled to the N+4th horizontal scanning line, and the fifth drain is electrically coupled to the gate signal point, and the fifth source is inputted with the DC low voltage; an upper electrode plate of the capacitor is electrically coupled to the gate signal point and a lower electrode plate of the first capacitor is electrically coupled to the Nth horizontal scanning line;

wherein a signal transmission way utilized by the gate driving circuit is that the N−4th horizontal scanning line transmits the signal to the Nth horizontal scanning line; an amount of the high frequency clocks are eight; all of the first transistor, the second transistor, the third transistor, the fourth transistor and the fifth transistor are thin film transistors;

wherein in 2D mode, two adjacent high frequency clocks are spaced a half pulse width apart;

wherein in 3D mode, phases of the 1th high frequency clock and the 2nd high frequency clock are the same, and the phases of the 3rd high frequency clock and the 4th high frequency clock are the same, phases of the 5th high frequency clock and the 6th high frequency clock are the same, and the phases of the 7th high frequency clock and the 8th high frequency clock are the same, and two adjacent high frequency clocks with different phases are spaced a half pulse width apart;

wherein the pull-up compensation part comprises a sixth transistor, and the sixth transistor comprises a sixth gate, a sixth source and a sixth drain, and the sixth gate is inputted with a m−2th high frequency clock, and the sixth drain is electrically coupled to a N−2th horizontal scanning line or a N−2th transmission signal, and the sixth source is employed as an output end of the pull-up compensation part to be electrically coupled to the gate signal point; a signal transmission way utilized by the gate driving circuit is that the N−4th horizontal scanning line transmits the signal to the Nth horizontal scanning line or that the N−4th transmission signal transmits the signal to the Nth transmission signal; the sixth transistor is a thin film transistor.

* * * * *